United States Patent
Oh et al.

(10) Patent No.: US 9,252,241 B2
(45) Date of Patent: Feb. 2, 2016

(54) SELF-ALIGNED THIN FILM TRANSISTOR AND FABRICATION METHOD THEREOF

(71) Applicant: Electronics and Telecommunications Research Institute, Daejeon (KR)

(72) Inventors: Him Chan Oh, Seoul (KR); Chi Sun Hwang, Daejeon (KR); Sang Hee Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 15 days.

(21) Appl. No.: 14/031,100

(22) Filed: Sep. 19, 2013

(65) Prior Publication Data

US 2014/0145180 A1    May 29, 2014

(30) Foreign Application Priority Data

Nov. 23, 2012  (KR) .................. 10-2012-0133471

(51) Int. Cl.
*H01L 29/66* (2006.01)
*H01L 29/786* (2006.01)
*H01L 29/45* (2006.01)

(52) U.S. Cl.
CPC .......... *H01L 29/66742* (2013.01); *H01L 29/45* (2013.01); *H01L 29/66969* (2013.01); *H01L 29/7869* (2013.01)

(58) Field of Classification Search
CPC ............ H01L 29/66765; H01L 29/4908; H01L 29/66757; H01L 29/42384; H01L 29/78696; H01L 27/1214; H01L 27/1108; H01L 21/0274; H01L 27/11; H01L 29/458
See application file for complete search history.

(56) References Cited

U.S. PATENT DOCUMENTS

| | | | | |
|---|---|---|---|---|
| 6,777,254 B1* | 8/2004 | Yamazaki | .......... | H01L 27/1214 257/E27.111 |
| 8,759,186 B2* | 6/2014 | Yeh | ...... | H01L 29/7869 438/181 |
| 2005/0153521 A1* | 7/2005 | Kanamitsu | ...... | H01L 21/823878 438/424 |
| 2009/0092928 A1* | 4/2009 | Burberry | ............. | H01L 21/0272 430/315 |
| 2013/0029491 A1* | 1/2013 | Lee | ...... | H01L 21/3065 438/696 |
| 2013/0299873 A1* | 11/2013 | Disney | ............. | H01L 29/66909 257/192 |

FOREIGN PATENT DOCUMENTS

JP     2009-206388 A    9/2009
KR   10-2011-0058076 A   6/2011

OTHER PUBLICATIONS

Cheng-Han Wu et al., "Self-Aligned Top-Gate Coplanar In—Ga—Zn—O Thin Film Transistors", Journal of Display Technology, Dec. 2009, pp. 515-519, vol. 5, No. 12.
Zhi Ye et al., "Zinc-Oxide Thin-Film Transistor With Self-Aligned Source/Drain Regions Doped With Implanted Boron for Enhanced Thermal Stability", IEEE Transactions on Electron Devices, Feb. 2012, pp. 393-399, vol. 59, No. 2.

* cited by examiner

*Primary Examiner* — Jaehwan Oh
(74) *Attorney, Agent, or Firm* — Rabin & Berdo, P.C.

(57) ABSTRACT

Disclosed are a self-aligned thin film transistor capable of simultaneously improving an operation speed and stability and minimizing a size thereof by forming source and drain electrodes so as to be self-aligned, and a fabrication method thereof. The method of fabricating a thin film transistor according to an exemplary embodiment of the present disclosure includes: forming an active layer, a gate insulator, and a gate layer on a substrate; forming a photoresist layer pattern for defining a shape of a gate electrode on the gate layer; etching the gate layer, the gate insulator, and the active layer by using the photoresist layer pattern; depositing a source and drain layer on the etched substrate by a deposition method having directionality; and forming a gate electrode and self-aligned source electrode and drain electrode by removing the photoresist layer pattern.

17 Claims, 8 Drawing Sheets

SELF-ALIGNED THIN FILM TRANSISTOR AND FABRICATION METHOD THEREOF

CROSS-REFERENCE TO RELATED APPLICATIONS

This application is based on and claims priority from Korean Patent Application No. 10-2012-0133471, filed on Nov. 23, 2012, with the Korean Intellectual Property Office, the disclosure of which is incorporated herein in its entirety by reference.

TECHNICAL FIELD

The present disclosure relates to a self-aligned thin film transistor, and a fabrication method thereof, and more particularly, to a technology of forming source and drain electrodes of a thin film transistor with a separate electrode material, not by doping for an oxide semiconductor.

BACKGROUND

A thin film transistor employing an oxide semiconductor as an active layer may be processed at a low temperature and with low costs, and also obtain a high mobility characteristic, thereby attracting attentions as a backplane device of an active drive-type display. Recently, technologies of forming source and drain electrodes so as to be self-aligned by using a gate electrode as a mask in manufacturing an oxide semiconductor thin film transistor have been suggested.

Figure 1:
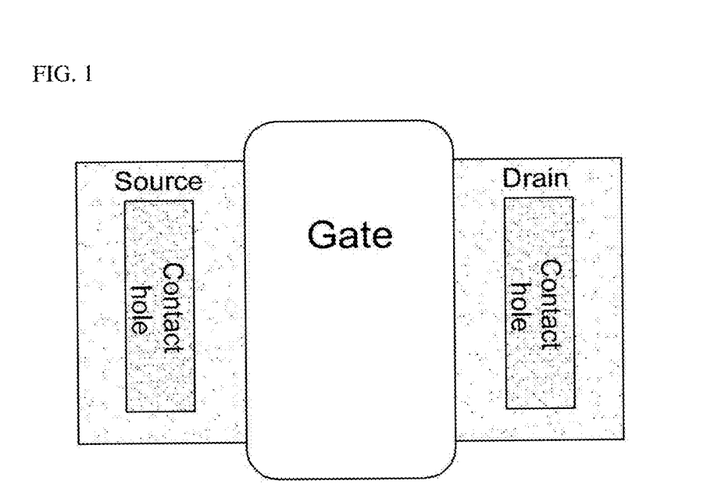
FIG. 1 is a configuration diagram of a thin film transistor according to the related art.

FIG. 1 is a configuration diagram of a thin film transistor in the related art.

In the related arts, source and drain electrodes are formed by doping hydrogen in source and drain regions or performing a plasma treatment on the source and drain regions. However, in a case where the aforementioned methods are performed, as a subsequent process, such as a heat treatment, is performed, a doping effect gradually deteriorates, so that there is a possibility in that an operation characteristic of a transistor will deteriorate. In a case where an element, other than hydrogen, is doped, an activation temperature of a dopant is high, so that a problem may occur in that it is difficult to apply the method to a substrate, such as glass or plastic, having a poor heat resistance characteristic.

In order to implement a high resolution display, a region occupied by a thin film transistor within one pixel may be decreased by minimizing a size of the thin film transistor, and according to the related art, it is necessary to form the source and drain electrodes through the doping and then connect a separate wiring electrode to source and drain electrodes of the thin film transistor for an electronic circuit configuration. In this case, as illustrated in FIG. 1, in order to form an electrode connected to the source and drain regions, a margin necessary for mask alignment and a margin for a length and a width of a contact hole are generated, and as a result, there is a problem in that widths of the source and drain regions are increased.

SUMMARY

The present disclosure has been made in an effort to provide a thin film transistor capable of simultaneously improving an operation speed and stability and minimizing a size thereof by forming source and drain electrodes so as to be self-aligned by using a separate electrode material, not by doping, and a fabrication method thereof.

An exemplary embodiment of the present disclosure provides a method of fabricating a self-aligned thin film transistor, including: forming an active layer, a gate insulator, and a gate layer on a substrate; forming a photoresist layer pattern for defining a shape of a gate electrode on the gate layer; etching the gate layer, the gate insulator, and the active layer by using the photoresist layer pattern; depositing a source and drain layer on the etched substrate by a deposition method having directionality; and forming a gate electrode and self-aligned source electrode and drain electrode by removing the photoresist layer pattern.

In the etching, the gate layer may be etched so that a width of the gate electrode is smaller than a shape of the photoresist layer pattern. The active layer may be etched by adjusting an etching depth so that a part of a bottom portion of the active layer is left on the substrate.

The method may further include, when parts of the formed source electrode and drain electrode are formed on side walls of the etched active layer and gate insulator to be in contact with the gate electrode, oxidizing the parts of the source electrode and the drain electrode through a heat or plasma treatment.

Another exemplary embodiment of the present disclosure provides a method of fabricating a thin film transistor, including: forming an active layer, a gate insulator, and a gate layer on a substrate; forming a first photoresist layer pattern for defining a shape of a gate electrode on the gate layer; etching the gate layer, the gate insulator, and the active layer by using the first photoresist layer pattern; depositing a source and drain layer on the etched substrate by a deposition method having directionality; forming a second photoresist layer pattern for defining a shape of a source electrode and a drain electrode on the source and drain layer; etching the source and drain layer by using the second photoresist layer pattern; and forming a gate electrode and self-aligned source electrode and drain electrode by removing the first and second photoresist layer patterns.

Yet another exemplary embodiment of the present disclosure provides a self-aligned thin film transistor, including: a substrate; an active layer formed on the substrate; a source electrode and a drain electrode formed on the substrate and self-aligned in both side surfaces of the active layer; a gate insulator formed on the active layer; and a gate electrode formed on the gate insulator.

According to the exemplary embodiments of the present disclosure, it is possible to provide a thin film transistor capable of minimizing parasitic capacitor generation between a gate electrode and source and drain electrodes to achieve a high-speed operation, guaranteeing operation stability, and having a smaller size.

According to the exemplary embodiments of the present disclosure, a gate insulator and a gate electrode are deposited right after deposition of an oxide semiconductor layer (active layer), so that the insulator and the electrode may serve as a passivation layer, thereby preventing damage that may occur during various processes. Accordingly, it is possible to improve performance and reliability of a device, and an operation characteristic of the thin film transistor does not deteriorate even though a subsequent process including heat treatment is performed.

A high-temperature process for activating a dopant is not required when the thin film transistor is fabricated, so that the present disclosure may be applied to a substrate, such as glass or plastic.

The foregoing summary is illustrative only and is not intended to be in any way limiting. In addition to the illustrative aspects, embodiments, and features described above, fur-

BRIEF DESCRIPTION OF THE DRAWINGS

FIGS. 4 to 8 are views for describing various methods of forming gate, source, and drain electrodes.

DETAILED DESCRIPTION

In the following detailed description, reference is made to the accompanying drawing, which form a part hereof. The illustrative embodiments described in the detailed description, and drawings are not meant to be limiting. Other embodiments may be utilized, and other changes may be made, without departing from the scope of the invention.

FIGS. 2A to 2F are views for describing a method of fabricating a thin film transistor according to an exemplary embodiment of the present disclosure.

Referring to FIGS. 2A to 2F, a method of fabricating a thin film transistor according to an exemplary embodiment of the present disclosure includes sequentially forming an active layer 203, a gate insulator 205, and a gate layer 207 on a substrate 201, forming a photoresist layer pattern 209 for defining a shape of a gate electrode on the gate layer 207, sequentially etching the gate layer 207, the gate insulator 205, and the active layer 203 by using the photoresist layer pattern 209, depositing a source and drain layer 211 on the etched substrate 201 by a deposition method having directionality, and forming a gate electrode 207a, and self-aligned source electrode 211a and drain electrode 211b by removing the photoresist layer pattern 209.

Figure 2A:
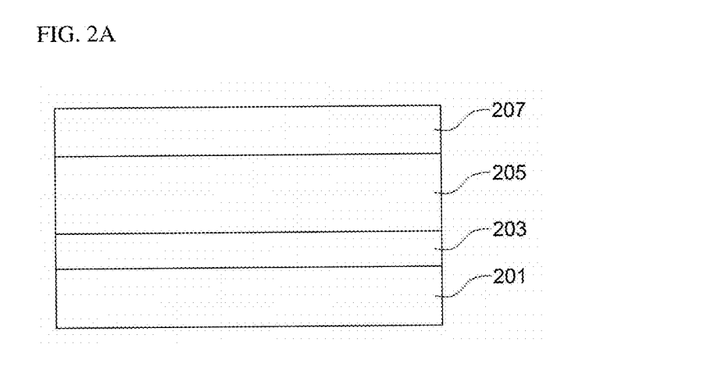
FIGS. 2A to 2F are views for describing a method of fabricating a thin film transistor according to an exemplary embodiment of the present disclosure.

First, as illustrated in FIG. 2A, the active layer 203, the gate insulator 205, and the gate layer 207 are sequentially deposited on the substrate 201, such as glass or plastic.

The active layer 203 may be formed of an oxide semiconductor, and the oxide semiconductor may be formed of zinc oxide (ZnO), indium oxide (InO), indium gallium zinc oxide (In—Ga—Zn—O), and zinc tin oxide (Zn—Sn—O), or oxide containing at least two elements among zinc (Zn), indium (In), gallium (Ga), tin (Sn), and aluminum (Al). Otherwise, the oxide semiconductor may be formed by doping various elements, for example, Zr, Hf, B, and Ni, on the oxide, or adding the various elements to the oxide in a form of a compound.

The gate insulator 205 may be formed of oxide, such as $Al_2O_3$, $HfO_2$, $ZrO_2$, $TiO_2$, $SiO_2$, $Ga_2O_3$, $Gd_2O_3$, $V_2O_3$, $Cr_2O_3$, $MnO$, $Li_2O$, $MgO$, $CaO$, $Y_2O_3$, and $Ta_2O_5$, or nitride, such as SiON, SiN, and $HfN_x$.

The gate layer may be formed of a material containing at least one of aluminum (Al), an aluminum alloy (Al alloy), tungsten (W), copper (Cu), nickel (Ni), chrome (Cr), molybdenum (Mo), titanium (Ti), platinum (Pt), tantalum (Ta), indium tin oxide (ITO), and indium zinc oxide (IZO).

Figure 2B:
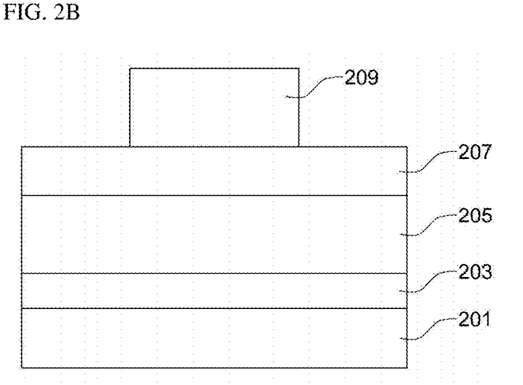
Figure 2C:
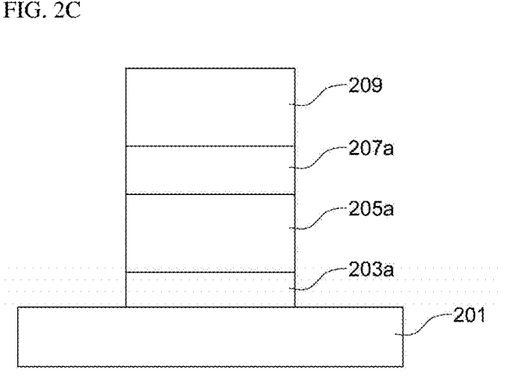

Next, as illustrated in FIGS. 2B and 2C, the photoresist layer pattern 209 having the shape of the gate electrode is formed on the gate layer 207, and then the gate layer 207, the gate insulator 205, and the active layer 203 are sequentially etched by using the photoresist layer pattern 209 as an etching mask. Through this, the gate electrode 207a is formed on the etched active layer 203a and gate insulator 205a.

Figure 2D:
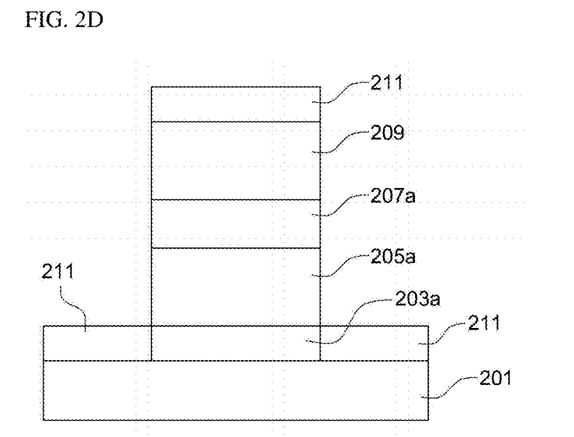
Figure 2E:
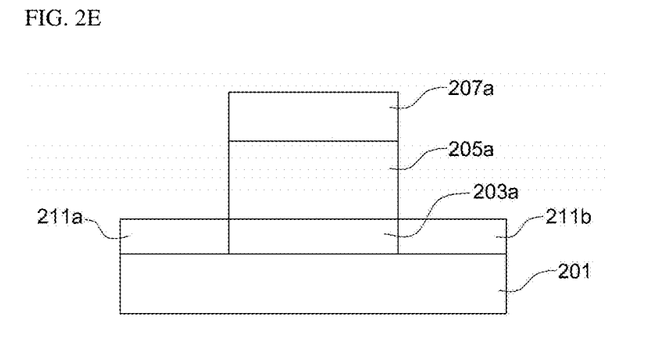

Next, as illustrated in FIGS. 2D and 2E, the source and drain layer 211 is deposited by the deposition method having directionality and then the photoresist layer pattern 209 is removed. Through this, the source and drain layer present on the gate electrode 207a is removed, so that the self-aligned source electrode 211a and drain electrode 211b are formed on the gate electrode 207a.

Figure 2F:
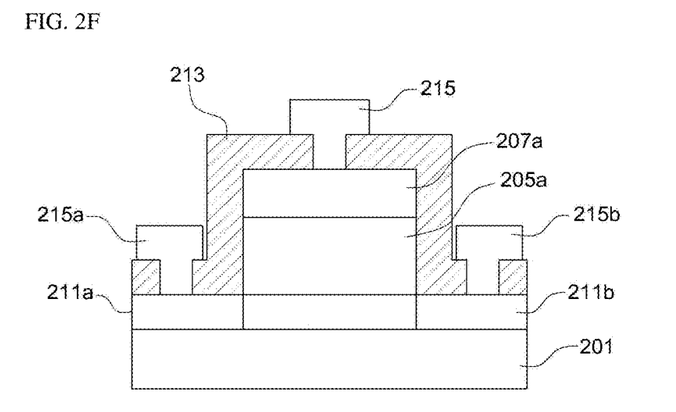

Subsequently, as illustrated in FIG. 2F, electrodes 215, 215a, and 215b, and a passivation layer 213 for transceiving data may be further formed while being in contact with the gate electrode 207a, the source electrode 211a, and the drain electrode 211b, respectively.

Figure 3A:
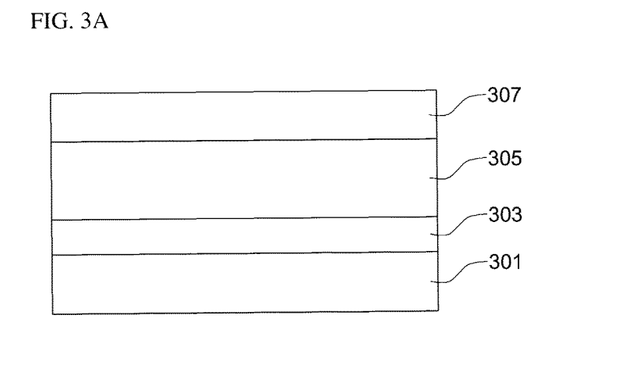
FIGS. 3A to 3E are views for describing a process of fabricating a thin film transistor according to another exemplary embodiment of the present disclosure.
Figure 3B:
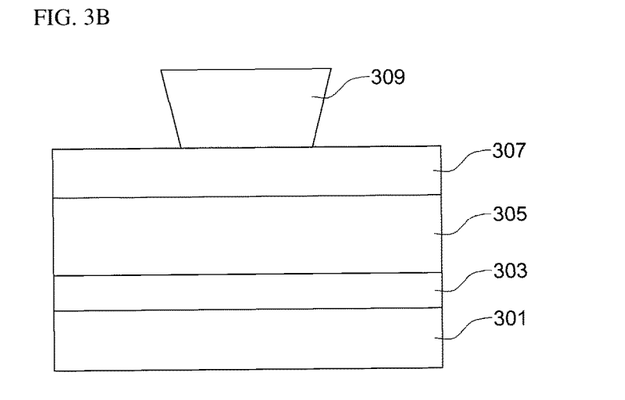
Figure 3C:
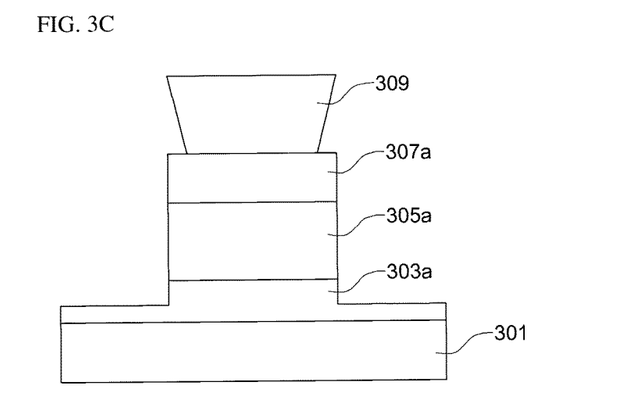
Figure 3D:
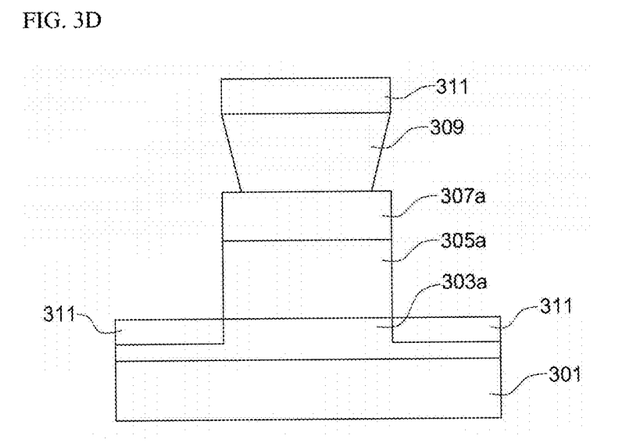
Figure 3E:
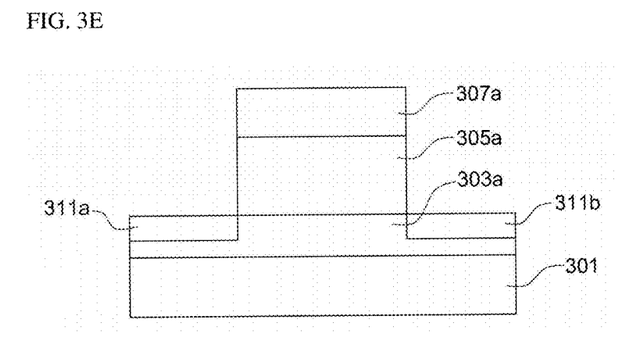

FIGS. 3A and 3E are views for describing a method of fabricating a thin film transistor according to another exemplary embodiment of the present disclosure.

First, as illustrated in FIGS. 3A and 3B, an active layer 303, a gate insulator 305, and a gate layer 307 are sequentially deposited on a substrate 301, and then a photoresist layer pattern 309 is formed. In this case, a slope of a side wall of the photoresist layer pattern 309 may be negative.

Next, as illustrated in FIGS. 3C and 3D, the gate layer 307, the gate insulator 305, and the active layer 303 are sequentially etched by using the photoresist layer pattern 309 as an etching mask, and a source and drain layer 311 is deposited thereon by a deposition method having directionality. In this case, as illustrated in FIG. 3C, the active layer 303 is not totally etched, but may be partially left, and through this, a better contact between a source electrode 311a and a drain electrode 311b, and an active layer 303a to be subsequently formed may be achieved. A side wall of the etched active layer 303a may have a positive slope, so that it is possible to prevent void from being generated between the active layers 303a when the source and drain layer 311 is deposited.

Next, as illustrated in FIG. 3E, the self-aligned source electrode 311a and drain electrode 311b are formed on a gate electrode 307a by removing the photoresist layer pattern 309.

Figure 4:
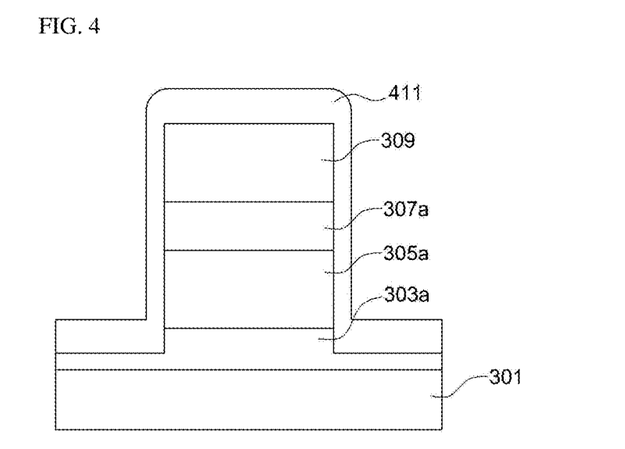
Figure 5A:
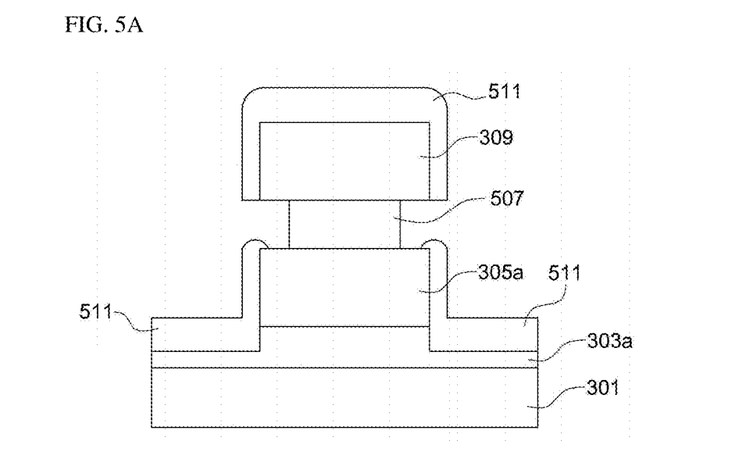
Figure 5B:
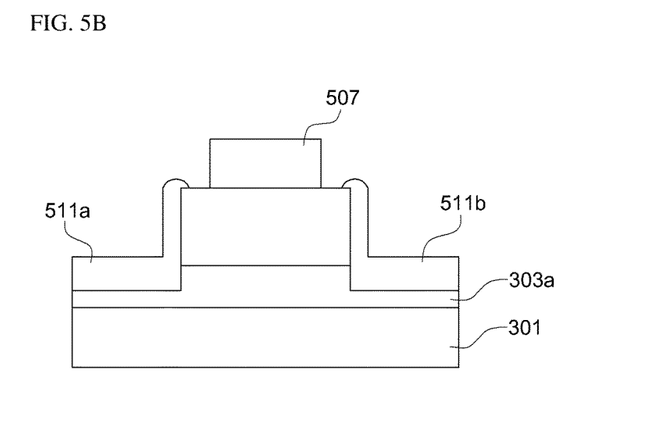

In the meantime, in the exemplary embodiment of FIGS. 3A to 3E, there may occur a case where a source and drain layer 411 completely covers the etching shape of the gate electrode 307a because directionality of the deposition method is weak when the source and drain layer 411 is formed as illustrated in FIG. 4, so that in this case, it is not easy to remove the photoresist layer pattern 309. In order to prevent the aforementioned case, a gate electrode 507 may be formed in a form having a narrower width than a shape of the photoresist layer pattern 309 by etching the gate layer 307 more deeply as illustrated in FIGS. 5A and 5B. In this case, a shading region is generated under the photoresist layer pattern 309, so that a source and drain layer 511 is not deposited on a side wall of the gate electrode 507, and through this, a short phenomenon due to a contact between the gate electrode 507 and the source and drain layer 511 may be prevented.

Figure 6:
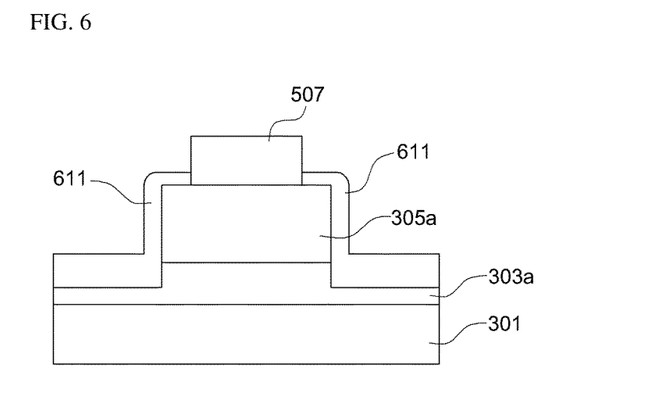
Figure 7:
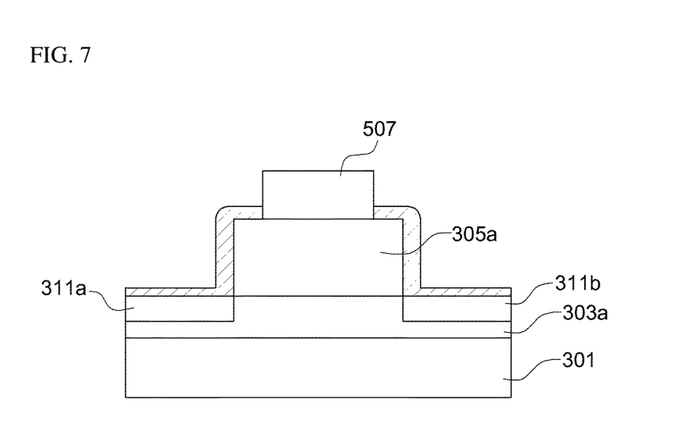

In a case where the gate electrode 507 is in contact with a source and drain layer 611 as illustrated in FIG. 6 even though the method illustrated in FIGS. 5A and 5B is used, a insulator may be formed by oxidizing a part of the source and drain layer 611 through a heat or plasma treatment as illustrated in FIG. 7. In this case, a part of the deposited source and drain layer 611 deposited on the side wall portions of the gate electrode 507 and a gate insulator 305a to meet the gate electrode 507 may be oxidized to be a nonconductor, and parts of a source electrode 311a and a drain electrode 311b meeting the active layer 303a may not be oxidized.

Figure 8:
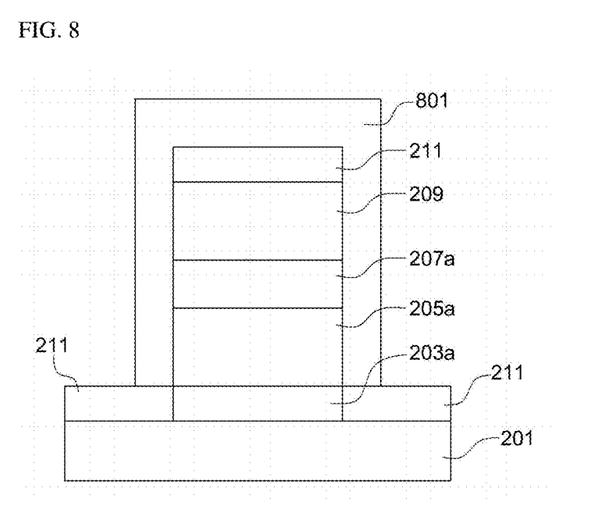

In the meantime, as illustrated in FIG. 8, a photoresist layer pattern 801 may be additionally formed in order to define a shape of the source electrode 211a and the drain electrode 211b in the exemplary embodiment of FIGS. 2A to 2F. In this case, source and drain regions are defined by forming the photoresist layer pattern 801 having the shape of the source and drain electrodes 211a and 211b before removing the photoresist layer pattern 209 having the shape of the gate electrode 207a, and the two photoresist layer patterns 209 and 801 may be removed at the same time. In another case, source and drain electrodes 211a and 211b are defined by forming the photoresist layer pattern 801 after having removed the photoresist layer pattern 209.

Figure 9:
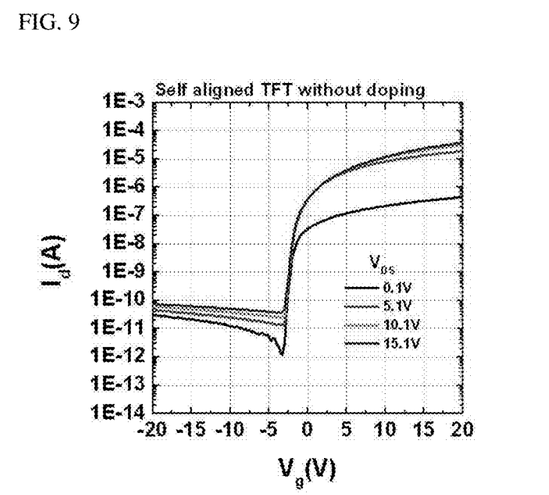
FIG. 9 is a view illustrating an operation characteristic of a thin film transistor actually fabricated according to the exemplary embodiments of the present disclosure.

FIG. 9 is a graph illustrating drain current $I_d$ according to a gate voltage $V_g$ of the thin film transistor actually fabricated according to the exemplary embodiments of the present disclosure, and it can be seen that a general switching operation of the thin film transistor is smoothly performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of fabricating a self-aligned thin film transistor, comprising:
    forming on a substrate, an active layer, a gate insulator, and a gate layer;
    forming a photoresist layer pattern for defining a shape of a gate electrode on the gate layer;
    etching, by using the photoresist layer pattern, each of the gate layer, the gate insulator, and the active layer;
    after the etching, depositing a source and drain layer on the substrate by a deposition method having directionality; and
    forming the gate electrode and self-aligned source electrode and drain electrode by removing the photoresist layer pattern.

2. The method of claim 1, wherein in the etching, the gate layer is etched so that a width of the gate electrode is smaller than a width of the photoresist layer pattern.

3. The method of claim 1, wherein in the etching, the active layer is etched by adjusting an etching depth so that a part of a bottom portion of the active layer is left on the substrate.

4. The method of claim 1, wherein parts of the formed source and drain electrodes are formed on side walls of the etched active layer and the etched gate insulator to be in contact with the gate electrode,
    the method further comprises:
        oxidizing the parts of the formed source and drain electrodes through a heat or plasma treatment.

5. The method of claim 1, wherein the active layer is formed of oxide containing at least one element selected from the group consisting of zinc (Zn), indium (In), gallium (Ga), tin (Sn), and aluminum (Al).

6. The method of claim 1, wherein the gate layer is formed of a material containing at least one selected from the group consisting of aluminum (Al), an aluminum alloy (Al alloy), tungsten (W), copper (Cu), nickel (Ni), chrome (Cr), molybdenum (Mo), titanium (Ti), platinum (Pt), tantalum (Ta), indium tin oxide (ITO), and indium zinc oxide (IZO).

7. A method of fabricating a self-aligned thin film transistor, comprising:
    forming, on a substrate, an active layer, a gate insulator, and a gate layer;
    forming a first photoresist layer pattern for defining a shape of a gate electrode on the gate layer;
    etching, by using the first photoresist layer pattern, each of the gate layer, the gate insulator, and the active layer;
    after the etching, depositing a source and drain layer on the substrate by a deposition method having directionality;
    forming a second photoresist layer pattern for defining shapes of a self-aligned source electrode and a self-aligned drain electrode on the source and drain layer;
    etching, by using the second photoresist layer pattern, the source and drain layer; and
    forming the gate electrode and the self-aligned source and drain electrodes by removing the first and second photoresist layer patterns.

8. The method of claim 7, wherein in the etching by using the first photoresist layer pattern, the gate layer is etched so that a width of the gate electrode is smaller than a width of the first photoresist layer pattern.

9. The method of claim 7, wherein in the etching by using the first photoresist layer pattern, the active layer is etched by adjusting an etching depth so that a part of a bottom portion of the active layer is left on the substrate.

10. The method of claim 7, wherein parts of the formed source and drain electrodes are formed on side walls of the etched active layer and the etched gate insulator to be in contact with the gate electrode,
    the method further comprises:
        oxidizing the formed parts of the source and drain electrodes and the drain electrodes through a heat or plasma treatment.

11. The method of claim 7, wherein the active layer is formed of oxide containing at least one selected from the group consisting element of zinc (Zn), indium (In), gallium (Ga), tin (Sn), and aluminum (Al).

12. The method of claim 7, wherein the gate layer is formed of a material containing at least one selected from the group consisting of aluminum (Al), an aluminum alloy (Al alloy), tungsten (W), copper (Cu), nickel (Ni), chrome (Cr), molybdenum (Mo), titanium (Ti), platinum (Pt), tantalum (Ta), indium tin oxide (ITO), and indium zinc oxide (IZO).

13. The method of claim 7, wherein in said forming a second photoresist layer pattern, the second photoresist layer pattern is formed on the first photoresist layer pattern.

14. The method of claim 7, wherein in said forming the gate electrode, the first and second photoresist layer patterns are simultaneously removed.

15. The method of claim 10, wherein in said oxidizing, the parts are oxidized so as to form an insulator within said parts.

16. The method of claim 4, wherein in said oxidizing, the parts are oxidized so as to form an insulator within said parts.

17. A method of fabricating a self-aligned thin film transistor, comprising:
    forming on a substrate, an active layer, a gate insulator, and a gate layer;
    forming a photoresist layer pattern, for defining a shape of a gate electrode, on the gate layer, wherein a slope of a side wall of the photoresist layer pattern is negative;
    etching, by using the photoresist layer pattern, each of the gate layer, the gate insulator, and the active layer, wherein a side wall of the etched active layer has a positive slope;

after etching, depositing a source and drain layer on the substrate by a deposition method having directionality; and forming the gate electrode and self-aligned source and drain electrodes by removing the photoresist layer pattern.

* * * * *